(12) United States Patent
Chua et al.

(10) Patent No.: US 7,344,906 B2
(45) Date of Patent: Mar. 18, 2008

(54) STRUCTURE AND METHOD FOR RELEASING STRESSY METAL FILMS

(75) Inventors: Christopher L. Chua, San Jose, CA (US); David K. Fork, Los Altos, CA (US); Koenraed F. Van Schuylenbergh, Sunnyvale, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 221 days.

(21) Appl. No.: 11/300,872

(22) Filed: Dec. 15, 2005

(65) Prior Publication Data

US 2007/0141742 A1    Jun. 21, 2007

(51) Int. Cl.
*H01L 21/00* (2006.01)
(52) U.S. Cl. ............... 438/48; 438/697; 438/706; 57/E21.001; 57/E21.002

(58) Field of Classification Search ............... 438/48
See application file for complete search history.

(56) References Cited

U.S. PATENT DOCUMENTS

| | | | |
|---|---|---|---|
| 6,544,430 B2* | 4/2003 | McCormack et al. | 216/67 |
| 2006/0196613 A1* | 9/2006 | Lamontagne et al. | 160/90 |
| 2007/0062264 A1* | 3/2007 | Wang et al. | 73/105 |

\* cited by examiner

*Primary Examiner*—Walter Lindsay, Jr.
*Assistant Examiner*—Abdulfattah Mustapha
(74) *Attorney, Agent, or Firm*—Kent Chen

(57) ABSTRACT

A method and structure for forming a spring structure that avoids undesirable kinks in the spring is described. The method converts a portion of a release layer such that the converted portion resists etching. The converted portion then serves as an anchor region for a spring structure deposited over the release layer. When the non-converted portions of the release layer are etched, the spring curls out of the plane of a plane.

19 Claims, 7 Drawing Sheets

STRUCTURE AND METHOD FOR RELEASING STRESSY METAL FILMS

BACKGROUND

Spring structures in MicroElectroMechanical systems (MEMS) have become increasingly important in a wide variety of applications. These applications include electronic packaging, test and measurement probing, integrated high quality factor inductors, electrical interconnects, fluid distribution and printing applications.

Traditional methods of forming small spring structures have disadvantages. Often the fabrication process used to produce these springs produce sharp angled bends or "kinks" in the spring at or near the point where the spring lifts up from the substrate such as is shown in FIG. 6. When the angled bend is oriented in a direction that opposes the spring flex the angled bend serves as a weak point that is prone to failure with repeated use.

Alternate fabrication techniques exist to avoid such bends. However, these alternative techniques use precisely controlled timing of etch rates. Etch rates depend on many parameters such as etchant concentrations, the exact composition and thickness of the layer being etched, and the spring geometry. Consistently reproducing the multiple parameters is difficult in a commercial production environment.

Thus a method for forming spring structures that does not rely on timing to control etching and results in spring structures that do not form angled bends that are susceptible to breakage is needed.

SUMMARY

A method of forming a suspended structure is described. The method converts a region of a release layer to form an anchor of the suspended structure. A release layer is first deposited over a substrate. At least one region of the release layer is treated to alter the chemical structure such that an anchor region of the release layer is resistant to a selective etchant and a release region of the release layer is etchable by the selective etchant. The selective etchant is then used to perform an etch of the release layer such that the release region releases a release portion of an overlying layer, the release portion of the overlying layer to form a suspended structure, an anchor portion of the overlying layer remains attached to the anchor region. The method described is useful for forming various structures, but has particular application in the fabrication of spring structures.

DETAILED DESCRIPTION

A planar self terminating release process for fabricating small suspended structures is described. The technique converts selected areas of a release layer to an etch resistant material. An overlying material is deposited over the release layer, the overlying material includes an anchor portion deposited over the converted etch resistant material. After etching the release layer, the etch resistant material serves as an anchor region that fixes an anchor portion of the overlying material to an underlying substrate. The remaining portion of the overlying material has been undercut and thus remains suspended. The described technique is particularly useful for forming spring structures.

Micro-spring structures are typically formed by depositing a spring material over a release layer. As used herein, "spring material" is broadly defined as any material upon which a stress may be induced to cause the material to curl out of a plane. Typically, after curling out of the plane, the spring material is flexible and can apply a force approximately proportional to displacement over a small distance. Example spring materials include MoCr alloys sputtered at different ambient pressures to induce a stress gradient within the thickness of the material, Ni electroplated using different chemistries to produce internal stress differences between the different layers, layers of bi-morph materials that have different internal stresses, and layers of bi-morph materials that have different thermal expansion coefficients. One particularly useful spring material is a "stressed metal". As used herein, "stressed metal" is defined as a spring structure with an internal stress gradient. Stressed metals are typically formed by depositing multiple sublayers, each sublayer deposited at a different temperature or pressure such that differing atomic packing densities in each sublayer result in an the internal stress gradient. A detailed description of forming a stressed metal spring is provided in U.S. Pat. No. 6,528,350 entitled "Method for Fabricating a Metal Plated Spring Structure" by David Fork and U.S. Pat. No. 5,613,861 entitled "Photolithographically Patterned Spring Contact" by Smith et al. which is hereby incorporated by reference.

Figure 1:
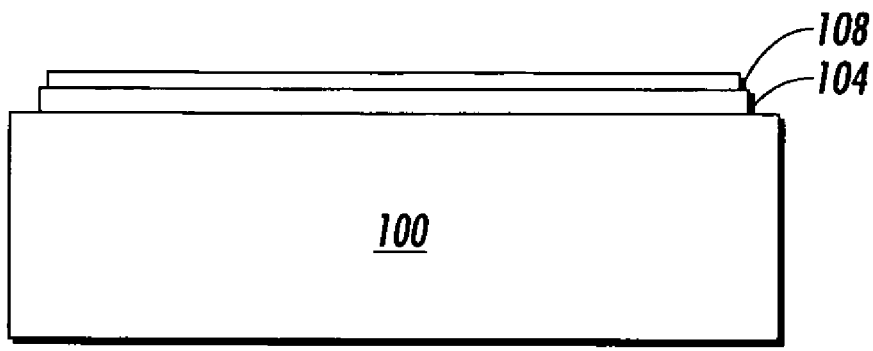
FIGS. 1-3 provide a schematic side view of an example lithography operation for forming a stressed metal spring.
Figure 2:
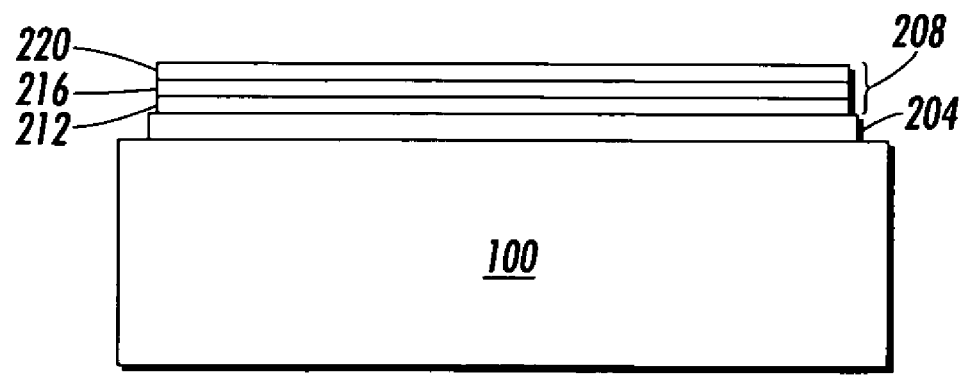
Figure 3:
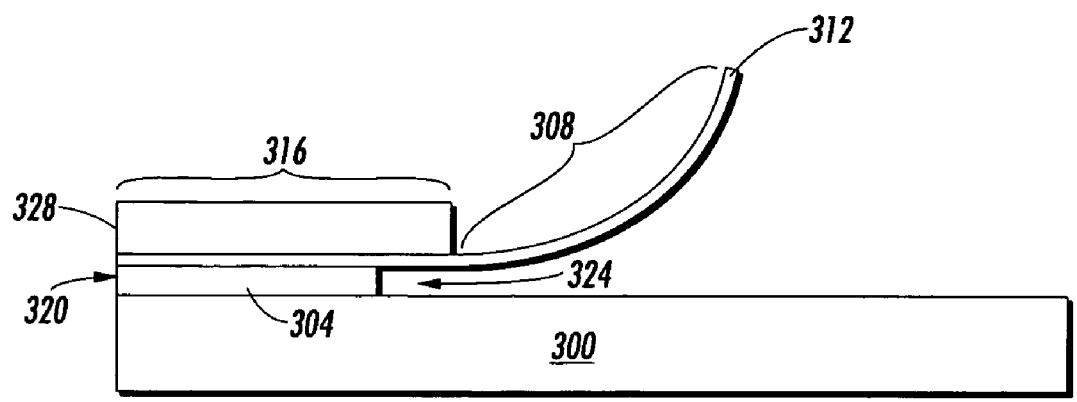

FIGS. 1-3 provide a schematic side view of an example lithography operation for forming a stressed metal spring. In FIG. 1, a release layer 104 and a seed layer 108 are deposited over a substrate 100. Release layer 104 is selected to be a material that can be easily etched to "release" a spring material that is subsequently deposited over the release layer. In one embodiment, release layer 104 is a sputtered titanium (Ti) layer.

Seed layer 108 is deposited over the release layer. Seed layer 108 facilitates growth or deposition of spring materials deposited over seed layer 108. An example seed layer is a gold (Au) layer deposited by sputtering techniques.

It is sometimes advantageous to combine release layer 104 and seed layer 108 into a single layer or use a single material for both layers. Combining the two layers reduces the number of deposition operations during fabrication. Examples of combined seed/release layer materials include, but are not limited to, silicon-nitride (SiN), titanium (Ti), copper (Cu) and/or nickel (Ni) deposited in a single layer over substrate 100.

In FIG. 2, a spring material 204 is deposited over release layer 104. In one example, spring material 204 is a metal such as nickel (Ni) deposited in a series of sublayers, 208, 212, 216 to create an internal stress gradient. Electroless or electroplating techniques may be used to deposit the spring material. In one example fabrication technique, the built in stress gradient is obtained by plating from two baths with different characteristics or by varying the current density during plating. A detailed description of forming such stress gradients during plating is provided in U.S. Pat. No. 6,528,350 entitled "Method for Fabricating a Metal Plated Spring Structure" by Fork et al. issued Mar. 4, 2003 which is hereby incorporated by reference.

In an alternate stressed metal fabrication technique, metallic layers are sputtered under gradually decreasing pressure such that the atomic spacing is larger in the upper sublayers of the spring material. The lower densities in the spring upper sublayers produce a stress gradient. A detailed description of using sputtering to form a stress gradient is provided in U.S. Pat. No. 5,613,861 entitled "Photolithographically Patterned Spring Contact" by Donald Smith et al. and hereby incorporated by reference in its entirety.

Although FIG. 2 shows a "stressed metal" spring material, it should be understood that the spring material is not limited to such metals. For example, a bimorph or bimetallic material may be used as a spring material. Temperature or other parameter changes induce stresses in the bimorph or bimetallic material causing the spring release portion to curl out of a spring plane. As used herein, the "spring plane" is the plane in which the release portion of the spring is originally deposited and is a plane typically parallel to the top surface of the release layer.

In order to release the spring material, part of the release layer is etched away. In one embodiment, the etching is an undercut wet etch. For example, the TFT Ti etch solution manufactured by the Transcene Company of Danvers, Mass. 01923 USA is an appropriate etchant for a Ti release layer. For SiN release layers, hydrofluoric and buffered hydrofluoric acid solutions may be used. In another embodiment, a XeF2 gas would be used to undercut vapor etch a silicon release layer. FIG. 3 shows etching of the release layer 304 to release a release portion 308 of spring material 312. The internal stress gradient in spring material 312 causes the spring material to uplift or curl out of the spring plane.

In the structure of FIG. 3, an unetched section of release layer 304 attaches an anchor portion 316 of spring material 312 to substrate 300. One method of fabricating the structure of FIG. 3 uses the spring itself as a mask for the etchant. When the spring is used as the mask, the spring geometry defines the unetched portion of release layer 304. The etchant gradually undercuts mask from the spring material 312 perimeter. To maintain the unetched section under anchor portion 316, the center of anchor portion 316 is further from the perimeter edge than any point in a release portion of the spring. Typically, this is done by making the anchor portion 316 of the spring material wider than the release portion 308 of spring material 312.

When etching, release portion 308 is released first and the etching process terminated before the entire spring anchor is undercut. The described technique is outlined in the previously referenced U.S. Pat. No. 5,613,861. However, such a technique limits the amount of control over the etching process as well as the spring shape design. In particular, precise timing of the etching process and larger anchor areas are needed. Furthermore, even when done properly, a substantial undercut 324 of the anchor portion 316 occurs. Release masks 328 patterned to cover wider areas than the anchor portion 316 can reduce but not eliminate the undercut 324.

Figure 4:
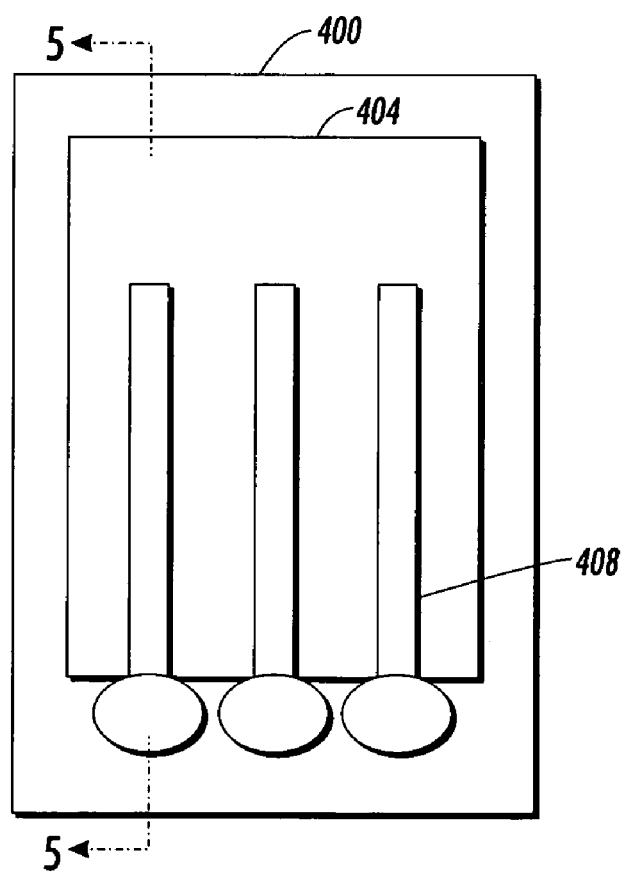
FIG. 4 shows a top view and FIG. 5 a side view of a spring fabrication method where the release layer is patterned prior to deposition of the spring material thereby allowing a portion of the spring material to adhere directly to an underlying substrate.

In an alternate spring fabrication method, the release layer is patterned prior to deposition of the spring material thereby allowing the spring material to adhere directly to the underlying substrate. FIG. 4 shows a top view and FIG. 5 a side view of such a structure. FIG. 4 shows release layer 404 patterned to expose substrate 400 prior to deposition of spring material 408.

Figure 5:
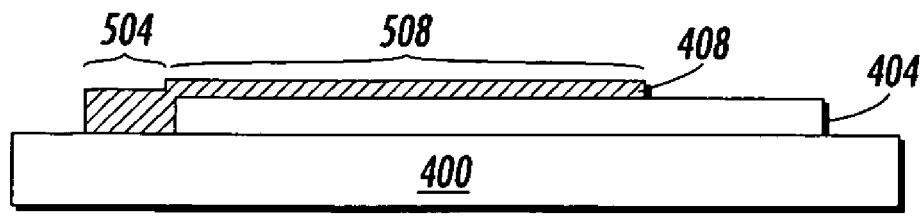

FIG. 5 shows a side view of the patterned release layer including the spring structure prior to spring release. As can be seen from FIG. 5, an anchor portion 504 of spring material 408 adheres directly to substrate 400 and a release portion 508 of spring material 408 rests over release layer 404. Thus when etching release layer 404, the process is self terminating in that all of release layer 404 may be removed with well defined spring take-off points. As used herein, "self terminating" means that further exposure to a selective etchant will not remove additional release layer material. As used herein, "take-off point" is defined as the point on the spring at which the bottom surface of the spring no longer contacts one of either the release layer or the substrate.

Figure 6:
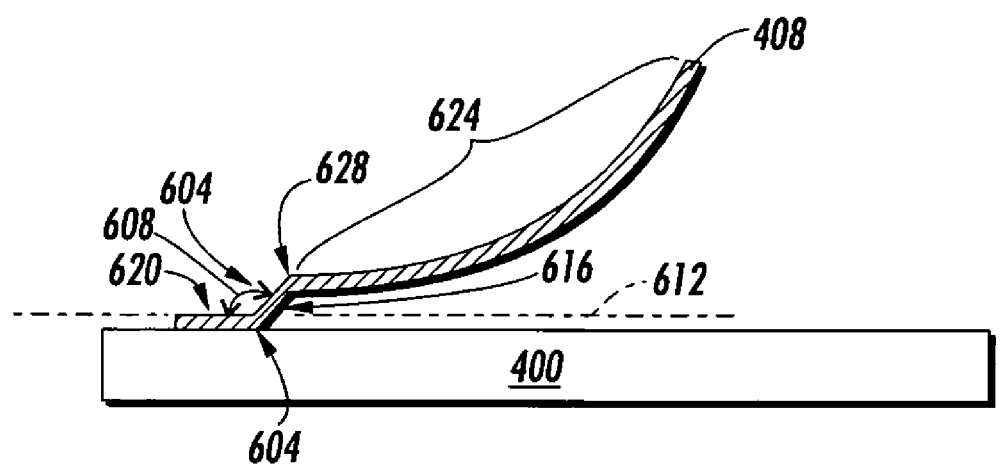
FIG. 6 shows a side view of a spring fabricated using a release layer patterned prior to deposition of the spring material.

However, the embodiment of FIG. 5 presents a problem in that after removal of release layer 404, and uplift of release portion 508, a discontinuity or "kink" occurs in the spring material at the former edge of release layer 404. FIG. 6 shows the discontinuity 604 in the first derivative of the spring material 408 after uplift. An upward directed interconnect segment 616 connects the spring anchor portion 620 to the spring release portion 624. A first angle 608 ranging between 0 and 180 degrees forms between the spring anchor plane 612 and the interconnect segment 616. As used herein, "spring anchor plane" 612 is defined as the plane that includes the spring anchor portion 620. A second angled edge 628 connects the termination of interconnect segment 616 and the beginning of release portion 624. The angled edges at the discontinuity represent weak points in the spring structure that lead to higher spring failure rates.

In order to either change the orientation of the discontinuity or to avoid the discontinuity altogether, an alternative fabrication method using a continuous release layer is described in FIG. 7-12 and the associated text. In the system described in the following description, an anchor portion of the release layer is converted to a non-etchable or etch resistant material prior to or after an overlying material, usually a spring material deposition. As used herein, "non-etchable" or "etch resistant" means that the material resists etching by the selective etchant selected to remove non-anchor portions of the release layer, thus enabling selective etching. It should be understood that "etch resistant" does not mean that the material will resist etching by all etchants that may be available. The spring anchor portion is deposited over the converted etch resistant material and a spring release portion is deposited over the non-converted etchable portion of the release material.

Figure 9:
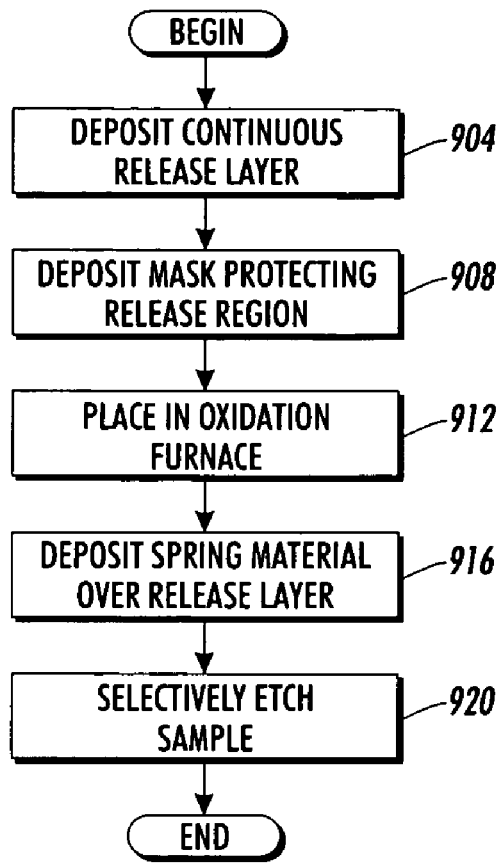
FIG. 9 is a flow chart that describes an example procedure of forming a suspended structure such as a spring by oxidizing a portion of a continuous release layer.

FIG. 9 is a flow chart that describes an example procedure for forming a suspended structure from an overlying material. As used herein, a "suspended structure" is defined as a structure that includes an anchor portion that is supported by an underlying layer and a suspended or overhang portion, (called herein, a release portion) that is prevented from dropping by its lateral attachment to the anchor portion. The resulting suspended structures formed may include, but are not limited to, cantilever structures, membrane structures and stressed metal springs. A brief description of example structures will follow, however, the fabrication description will primarily focus on stressed metal springs as one example.

Cantilever structures are suspended free hanging beams that remain in substantially the same plane after the release process as before the release layer is removed. These structures are used in many micro-electro mechanical system applications such as mechanical resonators for diagnosing the vibration characteristics of machine blocks. They can also form part of an electronic filter for tuning electronic signals.

Spring structures are similar to cantilever structures except the released portion of springs is designed to bend up or down out of the plane after release. Spring structures usually have a curved profile in the release portion, but the release portion can have different radius of curvatures at different positions. A part of the released portion may have a straight profile. Stressed metal springs are a class of springs made by engineering the stress properties of the springs to make the release portion bend in or out of the plane after an underlying release layer is removed.

Figure 13:
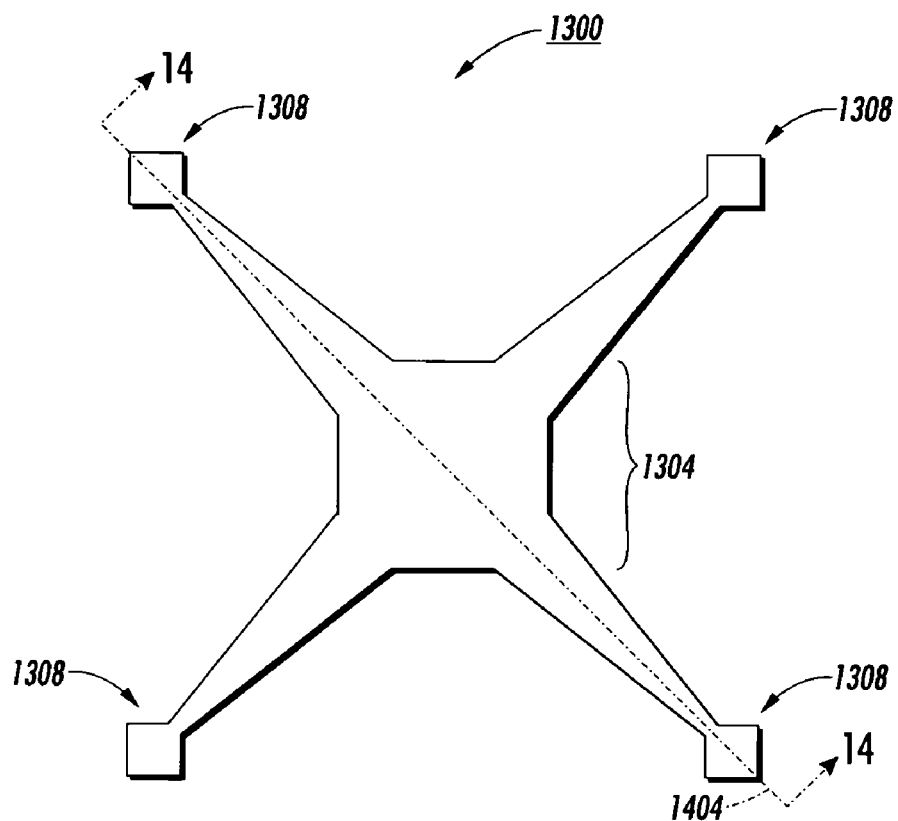
FIG. 13 shows a top view of an example membrane structure.
Figure 14:
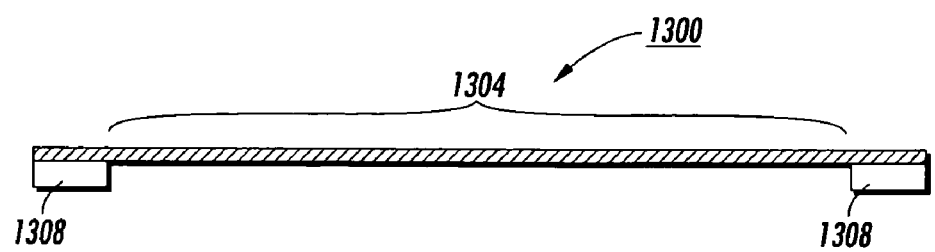
FIG. 14 shows a side cross sectional view of the membrane structure of FIG. 13.

Membrane structures are suspended sheets supported by two or more anchor portions. The sheet can either pop in or out of the plane after release or can remain on the same plane as before release. FIG. 13 shows a top view of an example membrane structure 1300 including a suspended portion 1304 supported by four anchors 1308. FIG. 14 shows a side cross sectional view of membrane structure 1300 along line 1404. Membrane structures are used in many applications including micro-mirrors in optical cross connect switches as taught in U.S. Pat. No. 6,411,427 entitled "Structure for an Optical Switch on a Glass Substrate" by Peeters et al. and as a Fabry-Perot element in wavelength tunable vertical-cavity surface-emitting lasers and optical filters.

Figure 7:
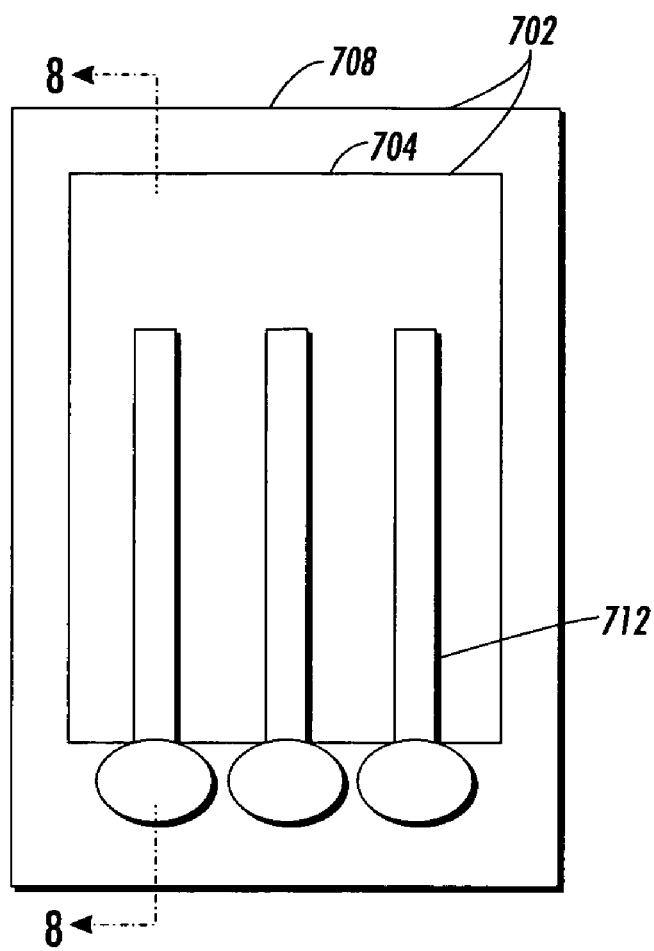
FIG. 7 shows a top view and FIG. 8 a side cross sectional view of a spring material deposited over a continuous release layer where an anchor region of the continuous release layer has been altered to resist etching.
Figure 8:
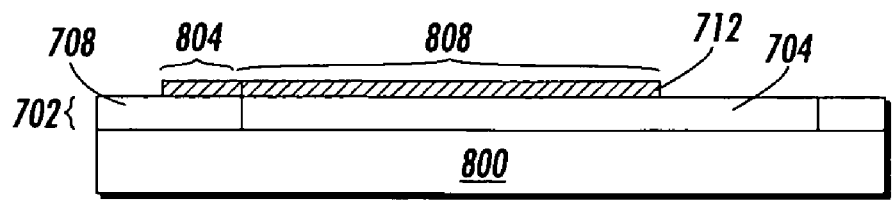

In the flow chart of FIG. 9, the final structure of a stressed metal spring is formed by converting a portion of a continuous release layer. As used herein, "continuous release layer" is defined as a release layer that exists and is continuous under every point of a deposited spring material such that no part of the spring material directly contacts the underlying substrate. FIG. 7 shows a top view and FIG. 8 shows a side cross sectional view of the formed structure at various points during fabrication.

In block 904 of FIG. 9, continuous release layer 702 of FIG. 7 is deposited over a substrate 800. In one embodiment, the continuous release layer is an etchable material such as a-Si (amorphous silicon), titanium, polymers such as Benzocyclobutene, or aluminum. Regions of the release layer are then identified as anchor regions 708 and release regions 704. In order to prevent anchor regions 708 from being etched, the chemical structure of anchor region 708 will be altered to make the anchor region 708 of release layer 702 resistant to etching. One method of altering the chemical structure to resist etching is through oxidation.

In block 908 of FIG. 9, a mask is deposited to protect release regions 704 of release layer 702. The unmasked portions of release layer 702, the anchor regions, are then exposed to a process or "treated" to alter the chemical structure of the anchor regions. Altering the chemical structure is broadly defined to include any alteration to the molecular structure that changes the properties of the material. Examples of chemical alteration include, but are not limited to crosslinking polymers when exposed to radiation, oxidation mechanisms, and implantation of impurities. In FIG. 9, the altering process described is an oxidation mechanism. Thus block 912 describes placing the spring sample in a standard wet oxidation furnace. The mask protects release regions 704, thus only anchor regions of release layer 708 are oxidized. Although oxidation of the entire thickness of anchor portion 708 provides the best resistance to etching, partial conversion where only a bottom portion of anchor region 708 may suffice in limited etching situations.

Oxidation converts anchor region 708 into an oxidized material. In the case of a-Si release layers, anchor region 708 converts into $SiO_2$. If aluminum or a high aluminum containing material such as AlAs is used as the release layers, the oxidized regions are typically converted to $Al_3O_2$. Although a-Si and Aluminum materials have been described, almost any material that is more resistant to etching upon oxidation may be used.

In block 916, an overlying layer of material such as spring material 712 is deposited over continuous release layer 902. In general "overlying material" is broadly defined to include any material that lies directly over and is supported by the release layer. The overlying material may be made from a variety of materials, although in the described spring fabrication, the overlying material is usually a metal or metal alloy. A spring anchor portion 804 is deposited over oxidized anchor region 708 and a spring release portion 808 is deposited over unoxidized release region 704. In one embodiment, spring material is a stressed metal as described in the description associated with FIGS. 1-3. As previously discussed, electroless or electroplating techniques may be used to deposit the spring material. In one embodiment, the built in stress gradient is obtained by plating from two baths with different stress characteristics or by varying the current density during plating. In an alternate technique, metallic layers are sputtered under gradually decreasing pressure such that the atomic spacing is larger in the upper spring sublayers resulting in a stress gradient.

After spring material 712 deposition, the sample is selectively etched in block 920. The selective etch etches the unoxidized release regions 704 but the treated oxidized anchor regions 708 resist etching. Assuming an a-Si release layer, an appropriate selective etchant is $XeF_2$ gas which removes the Si but does not remove $SiO_2$. Typically the selective etch etches up to the border of the release region and the anchor region of the release layer. Thus usually the selective etch is maintained long enough to remove all the release layer material in the release region.

Figure 10:
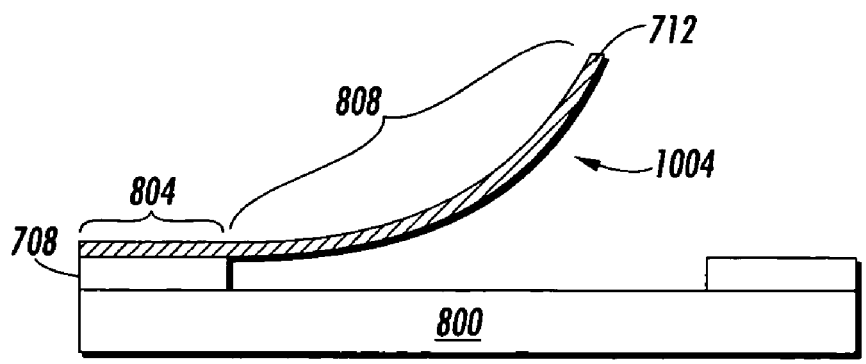
FIG. 10 shows an example side cross sectional view of a spring fabricated by converting an anchor region of a release layer.

FIG. 10 shows the resultant spring structure after etching. In FIG. 10, the spring 1004 is smooth and continuous between an anchor portion 804 and suspended portion or a release portion 808. As used herein, "smooth" means the first derivative of the spring is continuous across the entire spring surface and particularly in the region between anchor portion 804 and release portion 808. Thus a "smooth" surface is characterized by the absence of "kinks".

Although FIG. 9 shows one embodiment for depositing a suspended structure such as a spring structure over a treated release layer, other embodiments are possible. For example, in an alternative embodiment, the treatment of the release layer to make the anchor region resistant to etching or the release region susceptible to etching may occur after the overlying material such as the spring material is deposited. In an oxidation implementation, this may be accomplished by, performing block 916 of FIG. 9 ahead of block 908. Perforations or apertures in the spring anchor portion may be used to facilitate oxidation of the release layer under the spring anchor portion. Treating or oxidizing the release layer after spring deposition facilitates alignment by allowing the anchor portion 804 of FIG. 10 to be self-aligned to the etch-resistant layer 708.

An alternate method of treating a release layer after overlying material or spring material deposition uses ion implantation. In one example method of ion implantation, boron atoms are implanted in an a-Si (amorphous silicon) release layer. Initially, a spring material is deposited over the release layer. After deposition, the spring material can be patterned into the desired spring shape. Alternately, patterning the spring material can also be postponed to a later processing step. A mask such as photoresist is patterned over the spring material layer. The mask defines which regions of the release layer are to be treated, in this case, converted into an etch resistant material. A standard ion implantation machine implants Boron ions into the release layer. The masking material blocks the Boron ions. However, the boron ions easily penetrate unmasked areas of the thin spring material. The Boron-doped regions become selectively resistant to a selective etchants such as KOH. The result is similar to the result obtained by oxidizing the underlying release layers through perforations in the spring material.

Although processes have been described to treat the anchor region and thereby convert an anchor region of a generally etchable release layer into a etch resistant material; the reverse process of converting a release region of the release material to make the release region more etchable relative to the unconverted material is also possible. For example, release region 704 can be oxidized while anchor region 708 remains the original unmodified release material. A selective etchant that only etches the treated release region is then selected. One example of such a selective etchant is hydrofluoric acid which selectively etches the oxidized material in release region 704 but not untreated or unoxidized release layer material in anchor region 708. The selective etching thus releases spring section 708.

Figure 11:
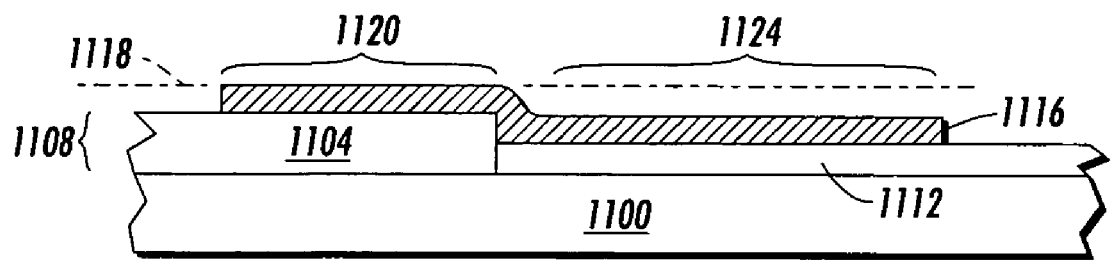
FIG. 11 shows a side cross sectional view of a spring material deposited over a continuous release layer where the anchor region of the continuous release layer expands when it is altered to resist etching.

FIGS. 7, 8 and 10 show an ideal structure. In actual formation, some materials, such as silicon, expand when oxidized. Silicon oxidation results in expansion of the oxidized layer by 127 percent. Thus, a 20 nm thick layer of Si can become a 45 nm thick layer when oxidized. FIG. 11 shows the effects of such an expansion prior to spring release. In FIG. 11, a silicon release layer is deposited over a substrate 1100. An anchor region 1104 of the release layer is oxidized. Resulting anchor region 1104 of release layer 1108 is thicker than the release region 1112. Thus after spring material 1116 is deposited over release layer 1108, the anchor portion 1120 of spring material 1116 is in an anchor plane 1118 that is higher than the release portion 1124 of the spring material.

Figure 12:
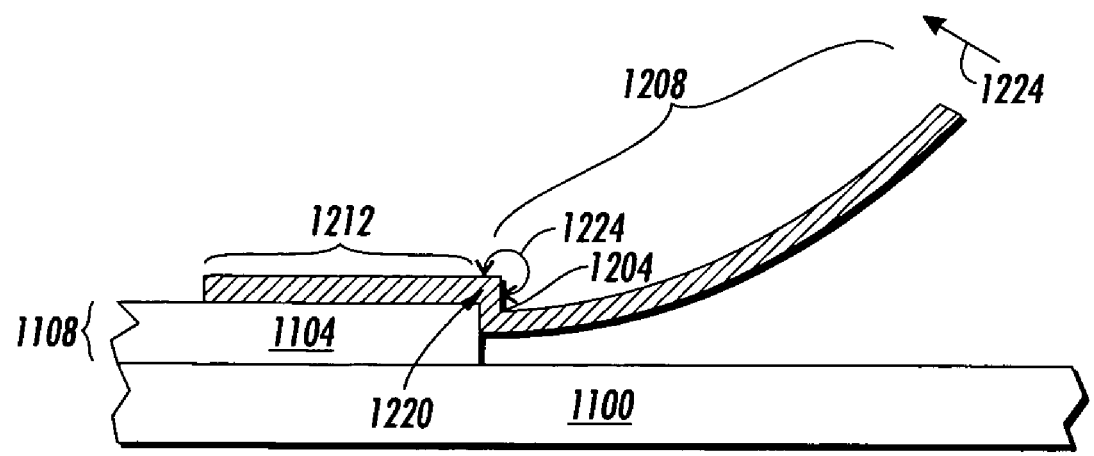
FIG. 12 shows a side cross sectional view of a spring fabricated using the method of FIG. 9 when an expansion of the release layer anchor region occurs.

FIG. 12 shows the spring structure of FIG. 11 after release. In the structure of FIG. 12, a discontinuity or "kink" occurs due to the fact that the release layer 1108 surface was not planar. In particular, anchor region 1104 top surface was above the release region 1108 top surface. Thus, the take off point 1204 where release portion 1208 begins to curl out of a plane parallel to the substrate is below the anchor plane that includes spring anchor portion 1212.

Interconnect segment 1220 connects spring anchor portion 1212 to spring release portion 1208. In particular, interconnect segment 1220 forms a first angle 1224 with spring anchor 1212. Unlike the kink of FIG. 6, the take off point is below the anchor plane. After release, the downward oriented bend of interconnect segment 1220 results in a spring oriented such that spring deflection along direction 1224 does not place excessive stress on the spring structure. Thus, unlike the bend of FIG. 6, spring breakage at the discontinuity is less of a problem. In practice, the downward kink in FIG. 12 is very small compared to the bend in FIG. 6. Particularly when the spring material is deposited before oxidation, the spring material 1120 and 1124 in FIG. 11 does not stretch much when release section 1104 is oxidized. In contrast, the upward bend 628 in FIG. 6 is formed by depositing spring material over a patterned step on the release layer. Depositing the spring over the step makes the upward bend a part of the spring shape by design.

To form the smooth spring structure of FIGS. 7, 8, and 10, a method of chemically altering an anchor region 708 of a release layer without a volumetric change is needed. One example method of inducing such a chemical change is to implant or otherwise diffuse Boron into a Si release layer in the anchor region. A boron concentration of 1020 per cubic centimeter is sufficient to render the anchor portion 708 non-etchable by KOH/water/alcohol wherein the activating alcohols may include isopropanol, secondary butanol, or tertiary butanol. However, one disadvantage of the described process is that KOH reacts with some common spring materials such as MoCr, thus the use of KOH limits the choice of spring materials to materials that withstand KOH such as Ni.

Other methods and materials may also be used to treat a region of release layer 702 of FIG. 7 to resist etching. For example, instead of oxidation, photodefinable dielectrics and photodefinable metal oxide films may be used for the release layer. Examples of photodefinable dielectrics include, but are not limited to HD-4000 i-line photodefinable polyiminide, SU-8, photo-Ormocers, and photo-Benzocyclobutene (BCB). Examples of photodefinable metal oxide films include those made by Brewer Science, Inc. of 2401 Brewer Drive, Rolla, Mo. 65401-9926 USA.

When using photodefinable material, only the anchor region 708 of release layer 702 is exposed to radiation. A mask deposited over release regions 704 may be used to control exposure to radiation. The mask protects release region 704 from the radiation. Alternatively, lasers may be used instead of masks. The lasers carefully direct radiation to irradiate only the anchor region 708 of release layer 702. Depending on the photocurable material used, the radiation may be visible light, UV light, or X-ray radiation. When photodefinable polymer is used for the release layer, the radiation is typically ultraviolet radiation (UV radiation) having a wavelength between 230 nm and 400 nm. A commonly used exposure wavelength is the 365 nm i-line of mercury lamps. The UV induces a chemical change by cross linking polymers in the anchor region of the release layer making the anchor region more resistant to etching.

After exposure to radiation, a selective etchant or developer removes the unexposed portions of the release layer 702. The actual selective etchant used depends on the material used for the release layer, but an example selective etchant is _BCB developers developed by Dow Chemical Co. (Midland, Mich.) when Benzocyclobutene is used for the release layer. Thermal curing after spring release may also further fix the anchor portion 708 of release layer 702.

Most of the prior description has been focused on converting an anchor region of a continuous release layer to make the anchor region resistant to etching. The described technique may be modified such that instead of converting an anchor region, two different materials are deposited. The two materials include a first etch resistant material deposited in the anchor region and a second etchable material deposited in the release region. Although using two entirely different materials in the anchor region and the release region provides flexibility in material selection, depositing two different materials involves additional masking and deposition steps thereby increasing fabrication costs. Furthermore, depositing two different materials extremely close together, with proper alignment, and approximately equivalent thicknesses is a complicated process that can result in lower yields.

The preceding specification has included numerous details that are intended to provide examples and to facilitate understanding of the invention and various uses of the invention. These details should not be used to limit the invention. For example, although the overlying material has been described as a spring material, usually a stressed metal material, other overlying materials may also be used. The formed structure is not necessarily even a spring. Thus, the invention should only be limited by the claims, as originally presented and as they may be amended, to encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:

1. A method of forming a suspended structure comprising the operations of: depositing a release layer over a substrate;
    treating at least one region of the release layer to alter the chemical structure of the at least one region such that an anchor region of the release layer is resistant to a selective etchant and a release region of the release layer is etchable by the selective etchant; and,
    performing an etch of the release layer using the selective etchant such that the release region releases a release portion of an overlying layer, the release portion forming a suspended structure, at least an anchor portion of the overlying layer remains attached to the anchor region.

2. The method of claim 1 wherein the overlying layer is a spring material, the release portion being the release portion of the spring material, the release portion curling out of a plane.

3. The method of claim 1 wherein the overlying layer is a membrane.

4. The method of claim 1 wherein the overlying layer is a cantilever.

5. The method of claim 1 wherein the anchor region is a treated region and the release region is an untreated region.

6. The method of claim 1 wherein the anchor region is an untreated region and the release region is a treated region.

7. The method of claim 1 further comprising the operation of:
    depositing the overlying layer over the release layer after treating the release layer such that the anchor portion of the overlying layer is deposited over the anchor region of the release layer and the release portion of the overlying layer is deposited over the release region.

8. The method of claim 1 wherein the release layer being treated is underneath the overlying layer deposited over the release layer.

9. The method of claim 8 wherein the spring material includes perforation to facilitate treating the release layer under the overlying layer.

10. The method of claim 9 wherein the perforations are in the anchor portion of the overlying layer such that the anchor region undergoes the treating operation.

11. The method of claim 1 wherein the treating operation is an oxidation.

12. The method of claim 1 wherein the treating operation is boron implantation into the treated region.

13. The method of claim 1 wherein the treating operation is exposure to UV light.

14. The method of claim 1 further comprising the operation of:
    masking the release layer such that only the unmasked portions are treated.

15. The method of claim 2 further comprising the operation of:
    depositing the spring material over the release layer wherein the spring material includes sublayers to form a stress gradient.

16. The method of claim 15 wherein the depositing of the spring material further comprises:
    sputtering a metal to form sublayers wherein lower sublayers are sputtered at a higher pressure than upper sublayers.

17. The method of claim 2 wherein the spring structure has a width at an anchor portion of the spring and a width at the release portion of the spring, the width at the anchor portion approximately matching the width at the release portion.

18. The method of claim 2 wherein after etching, the spring material curls out of the plane, the spring material forming a smooth transition from the anchor portion to the release portion.

19. The method of claim 2 wherein after the etch of the release layer, the spring material includes at least one kink, the kink angled downwards toward the substrate.

* * * * *